(12) United States Patent
Doerr

(10) Patent No.: US 12,007,506 B1
(45) Date of Patent: Jun. 11, 2024

(54) METHOD, SYSTEM, AND APPARATUS FOR A LIDAR SENSOR WITH VARYING GRATING PITCH

(71) Applicant: Acacia Communications, Inc., Maynard, MA (US)

(72) Inventor: Christopher Doerr, Middletown, NJ (US)

(73) Assignee: Acacia Communications, Inc., Maynard, MA (US)

( * ) Notice: Subject to any disclaimer, the term of this patent is extended or adjusted under 35 U.S.C. 154(b) by 1385 days.

(21) Appl. No.: 16/104,869

(22) Filed: Aug. 17, 2018

Related U.S. Application Data

(60) Provisional application No. 62/547,714, filed on Aug. 18, 2017.

(51) Int. Cl.
| | | |
|---|---|---|
| *G01S 7/481* | (2006.01) | |
| *G01S 17/42* | (2006.01) | |
| *G01S 17/89* | (2020.01) | |
| *G02B 5/18* | (2006.01) | |

(52) U.S. Cl.
CPC ............ *G01S 7/4817* (2013.01); *G01S 17/42* (2013.01); *G01S 17/89* (2013.01); *G02B 5/1819* (2013.01); *G02B 5/1866* (2013.01)

(58) Field of Classification Search
None
See application file for complete search history.

(56) References Cited

U.S. PATENT DOCUMENTS

| | | | | |
|---|---|---|---|---|
| 6,490,028 B1* | 12/2002 | Ditto | ................... | G01B 11/026 |
| | | | | 356/4.09 |
| 2013/0088726 A1* | 4/2013 | Goyal | ..................... | G01S 17/10 |
| | | | | 356/634 |
| 2014/0376001 A1* | 12/2014 | Swanson | ................ | G01N 21/17 |
| | | | | 356/479 |
| 2015/0346340 A1* | 12/2015 | Yaacobi | .................. | G01S 7/499 |
| | | | | 356/5.11 |
| 2016/0049765 A1 | 2/2016 | Eldada | | |
| 2017/0234984 A1* | 8/2017 | Khial | .................... | G01S 7/4817 |
| | | | | 356/5.1 |
| 2018/0364336 A1* | 12/2018 | Hosseini | ................. | G01S 17/42 |
| 2020/0182978 A1* | 6/2020 | Maleki | .................... | G01S 17/42 |

OTHER PUBLICATIONS

Doerr, et al., "O , E, S, C, and L Band Silicon Photonics Coherent Modulator/Receiver," in OFC, 2016, pp. 8-10.
Doylend, et al., "Hybrid III/V Silicon Photonic Source with Integrate 1D free-space Beam Steering," Opt. Lett. vol. 37, No. 20, 2012, pp. 4257-4259.
Poulton, et al., "Frequency-modulated Continuous-wave LIDAR Module in Silicon Photonics," in OFC, No. c, 2016, pp. 4-6.
Sun, et al., "Large-Scale Integrated Silicon Photonic Circuits for Optical Phased Arrays," in Adv. Photonics Commun., vol. 1, No. c, 2014, pp. 9-11.

* cited by examiner

*Primary Examiner* — Yuqing Xiao
*Assistant Examiner* — Jempson Noel
(74) *Attorney, Agent, or Firm* — K&L Gates LLP

(57) ABSTRACT

A method, apparatus, and system for imaging a scene by flood illuminating the scene with a wavelength sweeping laser.

16 Claims, 9 Drawing Sheets

METHOD, SYSTEM, AND APPARATUS FOR A LIDAR SENSOR WITH VARYING GRATING PITCH

CROSS-REFERENCE TO RELATED APPLICATIONS

The present application claims the benefit under 35 U.S.C. § 119(e) of U.S. patent application Ser. No. 62/547,714 filed Aug. 18, 2017, entitled "STEERING A BEAM WITH A GRATING," which is hereby incorporated herein by reference in its entirety. This present application is also related to U.S. patent application Ser. No. 16/104,866, filed Aug. 17, 2018, entitled "A METHOD, SYSTEM AND APPARATUS FOR A LIDAR SENSOR WITH A LARGE GRATING," and U.S. patent application Ser. No. 16/104,872, filed Aug. 17, 2018, entitled "LIDAR SENSOR WITH ORTHOGONAL ARRAYS," the entire disclosures of which are hereby incorporated by reference herein.

BACKGROUND

Scanning systems often transmit a signal and measure a reflection of the signal at a receiver.

BRIEF DESCRIPTION OF THE FIGURES

Various aspects and embodiments of the application will be described with reference to the following example embodiments. It should be appreciated that the figures are not necessarily drawn to scale.

SUMMARY

Figure 1A:
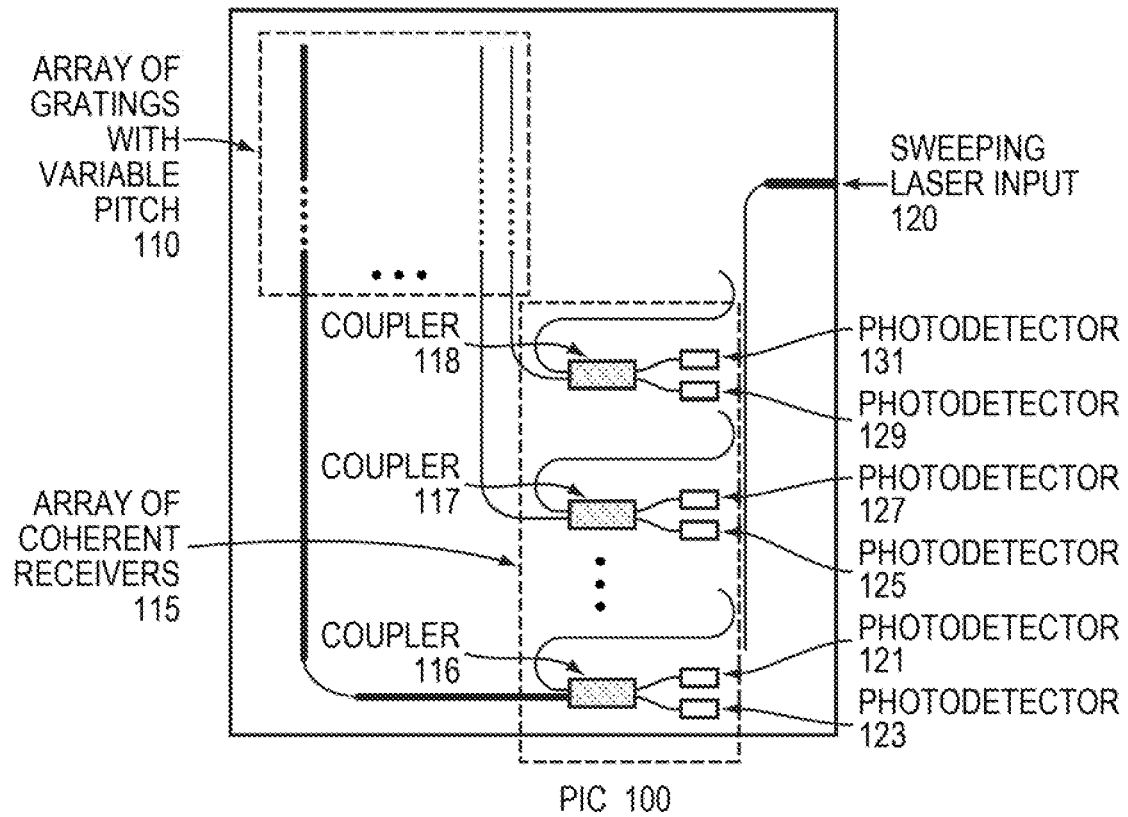
FIG. 1a is a simplified illustration of an optical receiving system, in accordance with an embodiment of the present disclosure.

A method, apparatus, and system for imaging a scene.

DETAILED DESCRIPTION

Generally, a LIDAR scanning system may be used to capture a 3D image of a scene. Typically, there may be a transmitter (Tx) that projects light and a receiver (Rx) that receives the reflection of the light. In conventional systems, a Tx scans a beam in 2D using a moveable mirror. Generally, a moveable mirror is large, expensive, and prone to failure. In many embodiments, the current disclosure has recognized that there may be benefits to "solid state" scanning that eliminates a moveable mirror.

The current disclosure has recognized that convention 2D solid state solutions, such as a 2D phased array of gratings, may be complex and difficult to scale because of a large number of controllable elements such as a 2D phased array of gratings. Usually, a 2D solid state scanner may use controllable elements to steer in one direction and wavelength tuning to steer in another direction. In many embodiments, the current disclosure recognizes that if wavelength tuning is used to steer direction, wavelength may not be used to measure depth.

Typically, scanning performed in 1D or 2D is performed with pulsed or modulated light and direct detection to determine distance. Generally, direct detection is used to detect reflected light. In many embodiments, the current disclosure has realized that direct detection may result in a limited resolution of a scan. In most embodiments, the current disclosure has realized that direct detection may be able to measure one photon at a time, with a single photon APD (SPAPD), which may limit detection if multiple photons are reflected from a given point due to the recovery time of the SPAPD.

In almost all embodiments, the current disclosure has realized that typical systems that use non-coherent light may not function well with partial reflections. In certain embodiments, the current disclosure has recognized that typical direct detect systems may not work well with trees where there may be partial reflections. In other embodiments, the current disclosure has realized that direct detect systems may be sensitive to interference from transmission from other direct detect systems.

In certain embodiments, the current disclosure may use coherent light to create a point cloud of a scene. In many embodiments, use of coherent light may enable a resolution around 100 times better than using a direct detect system. In some embodiments, a coherent detection system may offer microns of distance. In other embodiments, use of coherent light may offer tens of centimeters of distance. In many embodiments, the current disclosure has realized that conventional systems typically use direct detection and thus cannot use a phased array for the Rx. In certain embodiments, coherent light may refer to light of a similar or uniform wavelength and phase, such as that produced by a laser. In some embodiments, incoherent light may refer to light that has different phases or waves such as light produced by a lightbulb.

In most embodiments, use of coherent light may be resilient against interference of other light sources. In many embodiments, a coherent light scanning system may filter out light other than the frequency of a coherent light scan. In certain embodiments, a coherent scanning system may not receive interference from other light sources unless another coherent scanning system's laser sweeps are synchronized. In many embodiments, a coherent system may be able to enable four dimensional scanning, location plus movement, by measuring a Doppler shift or upshift in the frequency in received light.

In many embodiments, a phased array may mean optical emitters or receivers with a controllable phase for each element. In most embodiments, a phased shifter may be an optical element that can adjust phase of light. In certain embodiments, a grating may be an optical element with periodic spaced scattering elements.

In some embodiments, an array of gratings may be used to create an image of a scene from reflected light. In most embodiments, the current disclosure may use an array of coherent receivers to detect light from a transmitter. In most embodiments, by analyzing speed of interference fringes in relation to a sweeping speed of a laser, a distance may be calculated.

In many embodiments, a receiver may be an array of coherent receivers. In some embodiments, a coherent receiver may measure phase and may distinguish from which direction, in 1D, a beam is coming. In many embodiments, input to a transmitter may be a frequency-swept laser. In some embodiments, a portion of a frequency swept laser of a transmitter may be split off to act as a local oscillator for a coherent receiver array.

In some embodiments, 90° hybrids may be used in a receiver. In many embodiments, hybrids may be connected to photodiode pairs. In another embodiment, one photodetector per hybrid may be used in a receiver. In certain embodiments, photodiodes in each pair may be subtracted in a differential amplifier, and the resulting difference may be digitized in an analog-to-digital converter, which may be fed into a digital signal processor (DSP).

In some embodiments, a DSP may recover magnitude and phase of the light received by each surface grating. In most embodiments, by measuring a frequency of fringes of interference from a scanned object as a laser wavelength tunes, a DSP may determine depth information of the scanned object. In many embodiments, a transmitter and receiver may be part of a photonic integrated circuit (PIC). In certain embodiments, a PIC may be made in silicon photonics. In most embodiments, silicon photonics may permit high-contrast gratings, efficient phase shifters, compact waveguide circuits, and integrated photodiodes.

In certain embodiments, the current disclosure may include an array of coherent receivers. In some embodiments, an array of coherent receivers may be connected to an array of gratings. In most embodiments, pitch may vary from grating to grating in a small amount. In many embodiments, light of different wavelengths may couple into a grating at different efficiency depending on the angle of the light. In certain embodiments, how light couples with each grating may change by the angle of the light. In most embodiments, reflected light different parts of the scene may couple into different parts of the grating. In many embodiments, an angle of light may determine where the light comes from in the scene. In certain embodiments, as wavelength of a sweeping laser changes, different points of the scene may be coupled into the grating. In many embodiments, it may be possible to measure relative phase from grating to grating to tell laterally from what point of the scene the light is reflected.

In many embodiments, phased array emitters may be short gratings. In certain embodiments, a receiver may need to receive the same polarization of light as emitted by a transmitter. In a particular embodiment, a half-wave plate may be placed over either a transmitter or receiver array. In another embodiment, there may be orthogonal polarizations in transmitter and receiver waveguides, e.g., TE polarization in the transmitter waveguides and TM polarization in the receiver waveguides. In certain embodiments, polarization rotators and grating designs may be used. In other embodiments, waveguides of a transmitter grating and a receiver grating may be bent so the polarization of the received light is the same as the polarization of the transmitted light.

In certain embodiments, the current disclosure may enable a LiDAR sensor that uses an array of 1D grating couplers with varying pitch. In certain embodiments, a grating couple may be linear grating coupler. In other embodiments, a grating coupler may be a step-wise grating coupler. In further embodiments, a grating couple may be a non-linear grating coupler. In certain embodiments, with use of a passive array of 1D grating couplers with varying pitch a coherent signal processing may handle calibration and processing of received light. In some embodiments, Applicant has realized that it may be beneficial and easier to use coherent signal processing than to perform processing in optics. In certain embodiments, optics may be made in silicon photonics, which may have high contrast gratings, compact waveguide routing, and integrated photodiodes.

In many embodiments, use of coherent signal processing may enable a solution without using one or more phase shifters. In certain embodiments of the current disclosure, scanning of a scene may not occur as a system may use illumination of the scene. In some embodiments, a point source may be a transmitter and an array of long 1D gratings with coherent detection may act as a receiver. In certain embodiments, there may be a laser that tunes wavelength. In some embodiments, a tunable laser may be able to tune both over a wide and narrow wavelength range. In certain embodiments, a tunable laser that is able to tune over a wide and narrow wavelength range may be called a sweeping laser. In certain embodiments, a sweeping laser may illuminate a scene of interest by exiting the system through a small aperture, such as an optical fiber end or directly from a laser facet.

In most embodiments, light may reflect off a scene illuminated by a sweeping laser and may impinge on a photo integrated circuit (PIC). In many embodiments, reflections from different parts of a scene may fall on a grating array on a PIC at different angles. In certain embodiments, for angles changing about an axis parallel to a PIC surface and perpendicular to a grating waveguides, different angles may couple with different efficiencies into different-pitch grating couplers. In some embodiments, for up-down angles, different angles may couple with different relative phases into different-pitch grating couplers.

In many embodiments, light coupled into a grating coupler may proceed down waveguides. In certain embodiments, light proceeding down a waveguide may be interfered in couplers with local oscillator light split off from a sweeping laser illuminating a scene. In some embodiments, a coupler may be connected to a photodiode pair. In alternative embodiments, a single photodetector may be used for a coupler. In many embodiments, photocurrents from a photodiode in a balanced photodiode pair may be subtracted in a transimpedance amplifier. In certain embodiments, subtracted photocurrents may be sent to an analog-to-digital converter. In some embodiments, digitized values of light may be processed in a digital signal processor (DSP) to determine a 3D image of scene.

In certain embodiments, depth and up-down angle of received light may be determined from Fourier analysis of a swept laser interference fringes. In most embodiments, the farther away the point in a scene, the higher the frequency of fringes may be. In many embodiments, side-to-side location may be determined from a relative phase between neighboring gratings. In some embodiments, vertical location may be determined by the wavelength and relative phase between neighboring gratings.

In conventional solutions, gratings are used in a transmitter. In some embodiments of the current disclosure gratings may be used in a receiver. In conventional solutions, 1D gratings have the same pitch. In embodiments of the current disclosure, pitch may vary from grating to grating. In conventional solutions, wavelength is used for steering in one of the lateral dimensions, which precludes it from being used to measure depth (and thus pulsing must be used, which requires SPAPDs). In many embodiments of the current disclosure, wavelength may be used to measure depth.

In some embodiments, because a scene may be illuminated by a point source rather than a scanning beam, launched optical power may be significantly higher while meeting the eye safety requirements. In most embodiments, pixels in a scene may be constantly read simultaneously. In almost all embodiments, scanning latency may not be an issue. In most embodiments, there may not be phase shifters in a transmitter or a receiver.

In most embodiments, lack of phase shifters may save on fabrication, calibration, and power consumption. In many embodiments, lack of phase shifters also may move complexity into the signal processing of coherent detection, where it may be easier to handle. In certain embodiments, lack of phase shifters may simplify optical components. In most embodiments, coherent method of reception may allow for high sensitivity, high depth resolution, transparent object detection, and movement detection. In certain embodiments, no complex waveguide routing may be required, as in the case of a 2D array of short gratings. In many embodiments, at least some of the techniques herein may be scalable to very large arrays. In some embodiments, a large number of photodetectors and TIAs may be required. In certain embodiments, for the same total grating area, the total light collected may be small as for a given impingement angle and wavelength, only a fraction of the 1D gratings may couple in the light efficiently.

In many embodiments, a laser may sweep wavelength. In certain embodiments, a laser may continuously sweep wavelength. In most embodiments, a laser may illuminate a scene with flood illumination. In some embodiments, a laser may sweep over 1 nanometer. In certain embodiments, a sweep may be caused by varying the current of the laser. In other embodiments, a sweep may be caused by varying the temperature in a laser. In some embodiments, a laser may be 1.5 microns. In most embodiments, a simple laser may be used to illuminate a scene.

Refer now to the example embodiment of FIG. 1a, which illustrates an optical receiving system. In the example embodiment of FIG. 1a there is a photo integrated circuit (PIC) 100. PIC 100 has an array of gratings with variable pitch 110. Gratings 110 collect light that reflects from a scene and sends the light down waveguides to couplers, such as couplers 116, 117, and 118. Couplers 116, 117, and 118 interferes received light with light split off from a sweeping laser via sweeping laser input 120. Photodetectors pairs, such as pairs 121 and 123, 125, and 127, and 129 and 131, connected to couplers 116, 117, and 118 respectively, measure the difference between the received light from the scene and the interfered light from a sweeping laser. The output of the photodiodes is sent to an analog to digital converter that feeds the digital output to a digital signal processor (DSP).

Figure 1B:
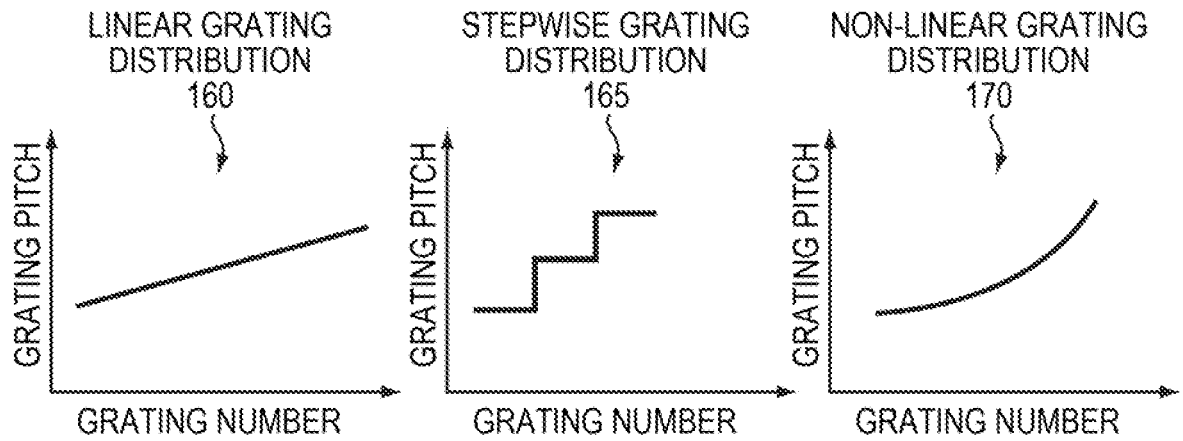
FIG. 1b is a simplified illustration of a linear grating distribution, a stepwise grating distribution, and a non-linear grating distribution, in accordance with embodiments of the present disclosure.

Refer now to the example embodiments of FIG. 1b, which illustrate different types of gratings. Linear grating distribution 160 represents the response of a linear grating. Stepwise grating distribution 165 represents the response of a stepwise grating. Non-linear grating distribution 170 represents the response of a non-linear grating.

Figure 2:
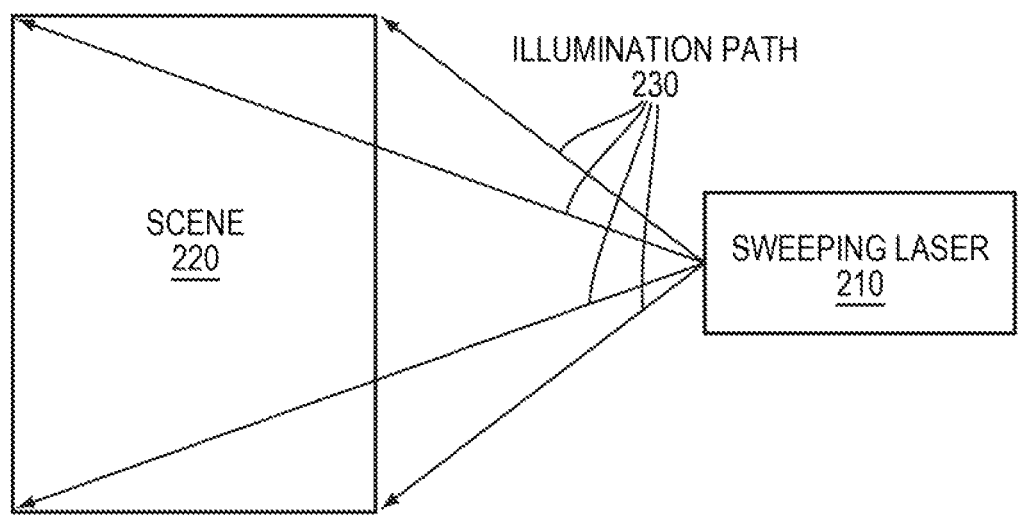
FIG. 2 is a simplified illustration of a sweeping laser illuminating a scene, in accordance with an embodiment of the present disclosure.

Refer now to the example embodiment of FIG. 2, which illustrates a sweeping laser illuminating a scene. In this example embodiment, sweeping laser 210 illuminates scene 220 through illumination path 230. In this example embodiment, sweeping does not refer to the laser scanning or sweeping back and forth rather refers to a laser sweeping over a wavelength range. In this example embodiment, scene 220 is illumined by the laser flooding the scene with light. In many embodiments, the diffusion of a laser to flood a scene may insure that the light is not harmful to a human eye. In most embodiments, a wavelength such as 1.5 microns may be used to ensure that flooding a scene is eye safe. In certain embodiments, a laser may be swept over a nanometer.

Figure 3:
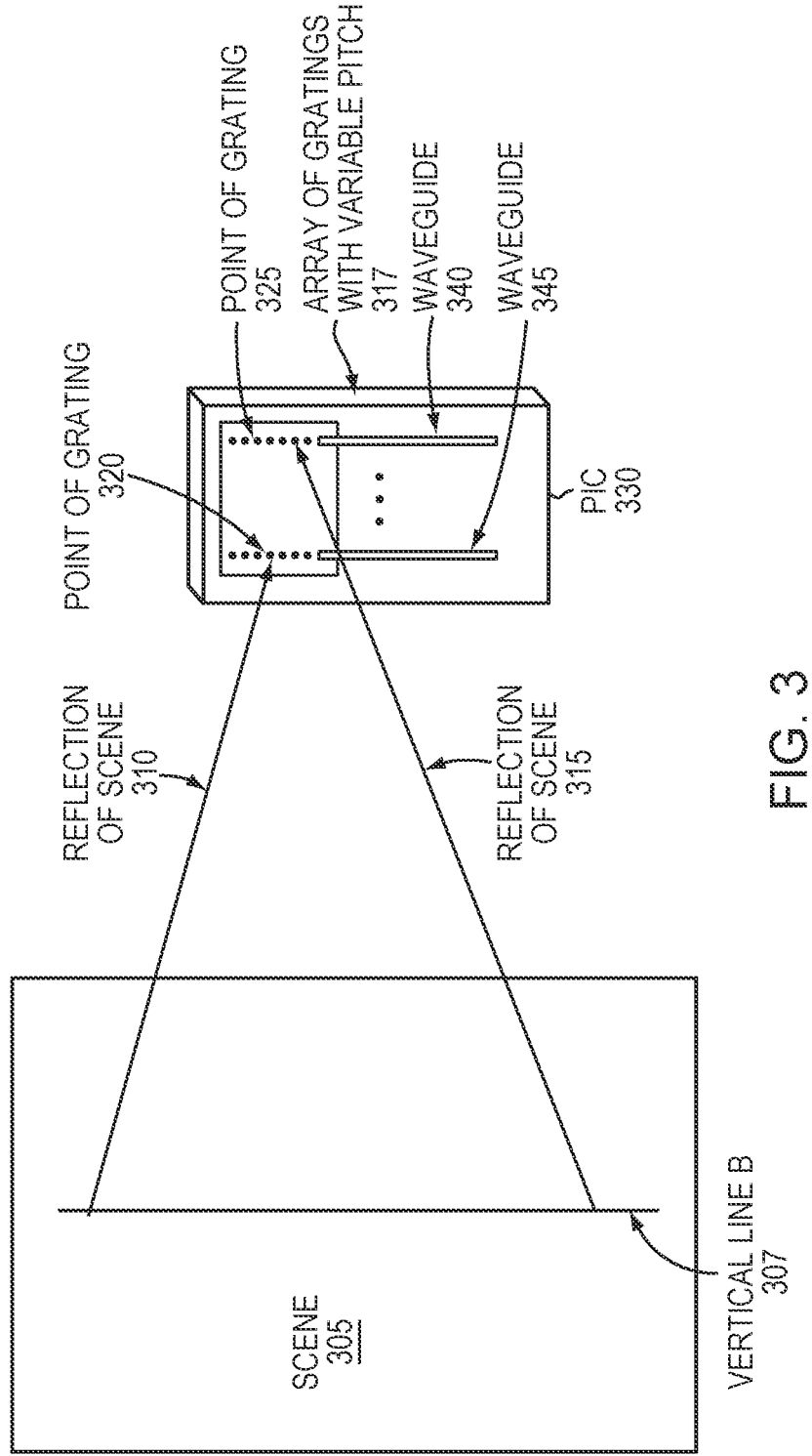
FIG. 3 is a simplified illustration of a PIC receiving reflections of two points of a scene showing vertical discrimination, in accordance with an embodiment of the present disclosure.

Refer now to the example embodiment of FIG. 3, which illustrates a PIC receiving light reflected from a scene. In FIG. 3, sample light reflecting from scene 305 from horizontal line 307 is illustrated as reflection of scene 310 and reflection of scene 315. Reflection of scene 310 hits array of gratings with variable pitch 317 at point of grating 320 on PIC 330. Reflection of scene 315 hits array of gratings with variable pitch 317 at point of grating 325 on PIC 330. Light captured by array of gratings 317 for reflection of scene 315 travels down waveguide 340. Light captured by array of gratings 317 for reflection of scene travels down waveguide 345.

Figure 4:
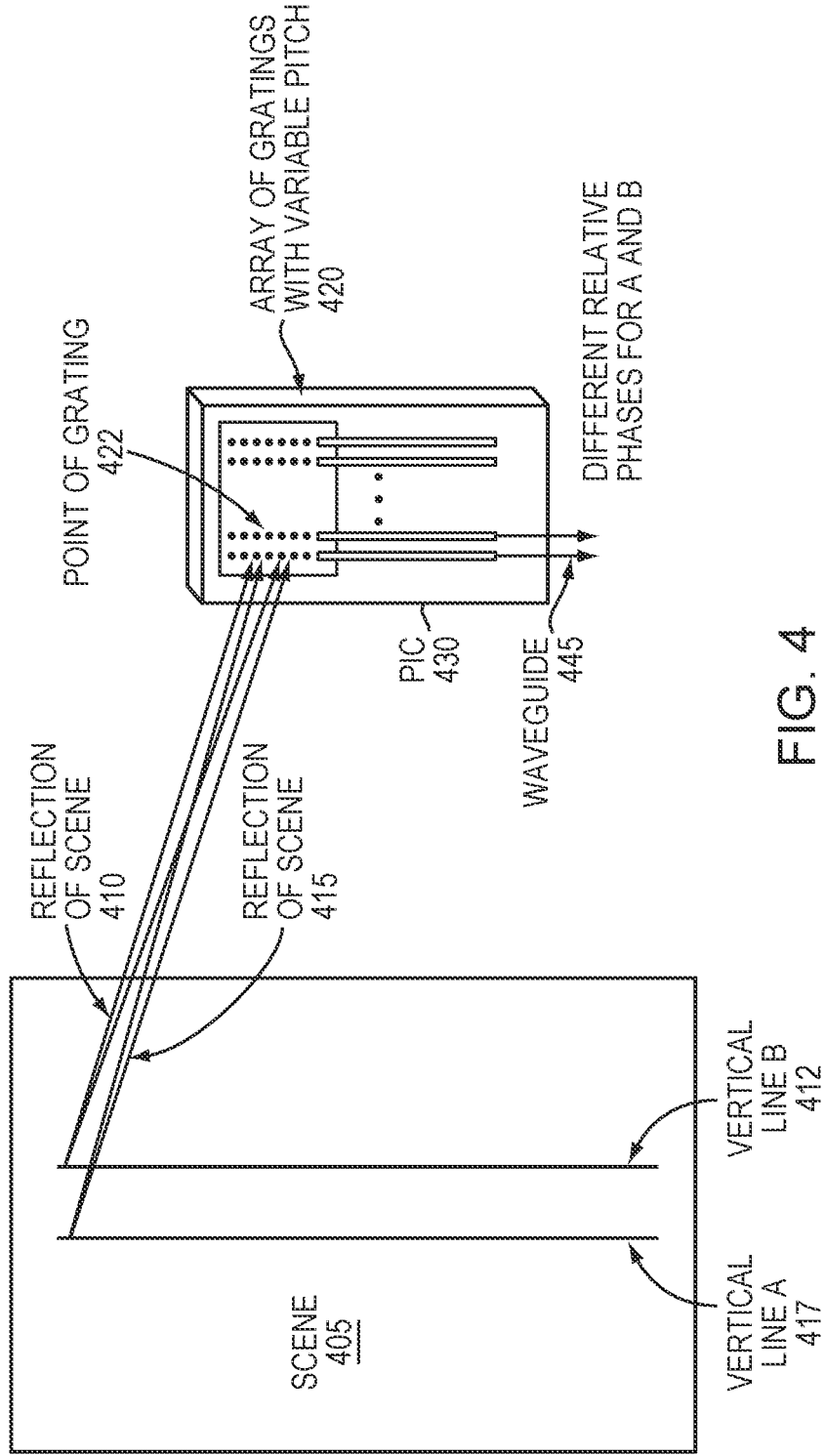
FIG. 4 is a simplified illustration of a PIC receiving reflections of two points of a scene showing horizontal discrimination, in accordance with an embodiment of the present disclosure.

Refer now to the example embodiment of FIG. 4, which illustrates a PIC receiving light reflected from a scene. In FIG. 4, sample light reflecting from scene 405 from horizontal line 412 is illustrated as reflection of scene 410. Sample light reflecting from scene 405 from horizontal line 417 is illustrated as reflection of scene 415. Reflection of scene 410 hits array of gratings with variable pitch 420 at point of grating 422 on PIC 430. Reflection of scene 415 hits array of gratings with variable pitch 420 at point of grating 422 on PIC 430. Light captured corresponding to reflection of scene 410 and reflection of scene 415 by array of gratings with variable pitch 420 travel down waveguide 445.

Figure 5:
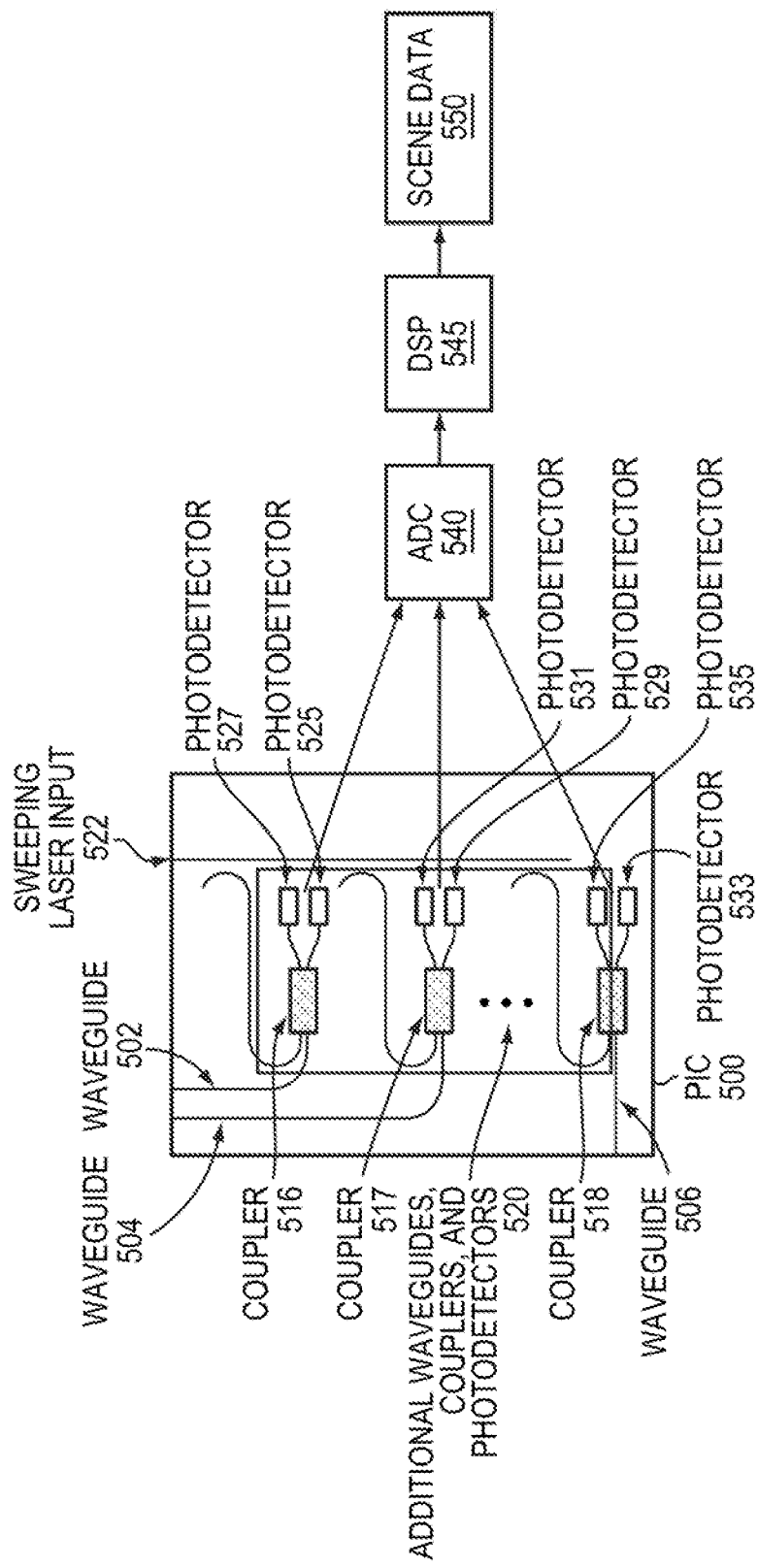
FIG. 5 is a simplified illustration of an optical receiving system with ADC and DSP, in accordance with an embodiment of the present disclosure.
Figure 6:
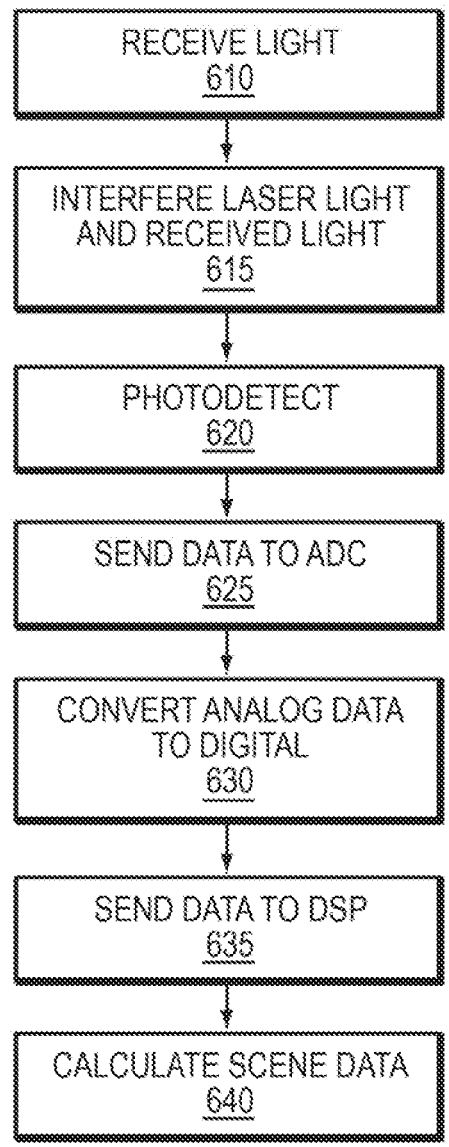
FIG. 6 is a simplified method for processing light received for an optical scan, in accordance with an embodiment of the present disclosure.

Refer now to the example embodiments of FIGS. 5 and 6, which are a simplified example of receiving and processing received light. PIC 500 has waveguide 502, 504, and 506, that feeds couplers 516, 517, and 518 respectively. As well, PIC 500 has additional waveguide, couplers, and photodetectors 520. Light is received from waveguides 502, 504 and 506 (Receive light 610). Couplers 516, 517, and 518 interfere or couple light received from waveguides 502, 504, and 506 with sweeping laser input 522 (step 615), where sweeping laser input 522 represents light split off from a sweeping laser used to illuminate a scene. Photodetectors 525 and 527 measure the differences or balance between received light waveguide 502 and light interfered from sweeping laser input 522 (step 620). Photodiodes 529 and 531 measure the differences or balance between received light waveguide 504 and light interfered from sweeping laser input 522 (step 620). Photodiodes 533 and 535 measure the differences or balance between received light from waveguide 505 and light interfered from sweeping laser input 522 (step 620). In this embodiment, similar measurements occur for additional waveguides, couplers, and photodetectors 520. The measured differences of the received light and sweeping laser input 522 are sent to Analog Digital Converter 540 (ADC)

(step 625). ADC 540 converts the analog data to digital data (step 630). ADC 540 sends the digital data to digital signal processor 545 (DSP) (step 635). DSP 545 calculates scene data 550 to determine depth and horizontal and vertical location for each pixel, which in this embodiment represents a point cloud of the scene (step 640).

Figure 7:
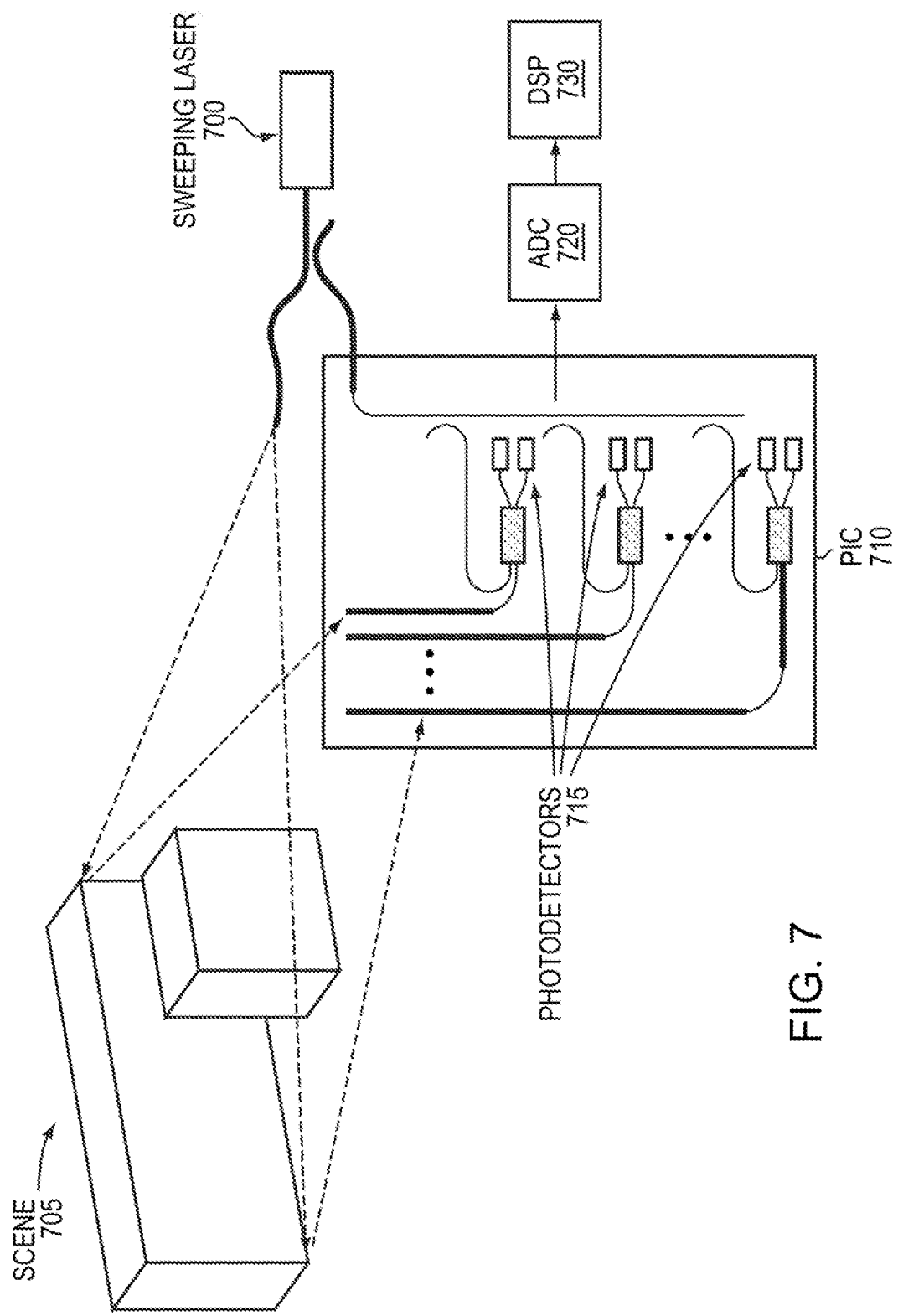
FIG. 7 is a simplified illustration of an optical scanning system scanning a scene, in accordance with an embodiment of the present disclosure.
Figure 8:
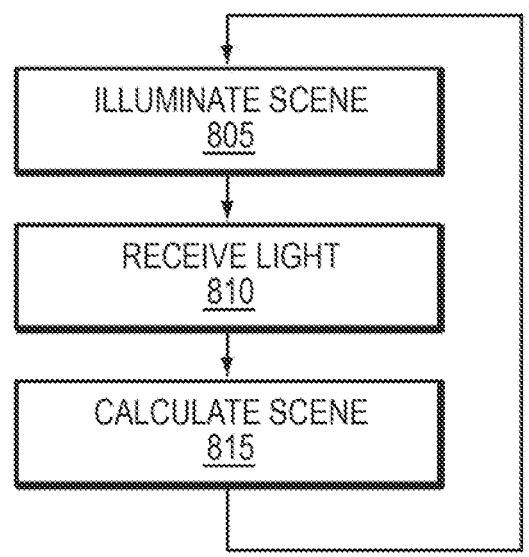
FIG. 8 is a simplified method for creating an optical scan, in accordance with an embodiment of the present disclosure.

Refer now to the example embodiment of FIGS. 7 and 8, which illustrate a simplified embodiment of scanning a scene. Sweeping laser 700 illuminates scene 705 (step 805). PIC 710 receives light reflecting off scene 705 (step 810). DSP 730 calculates the scene base on input from PIC 710 (step 815).

Figure 9:
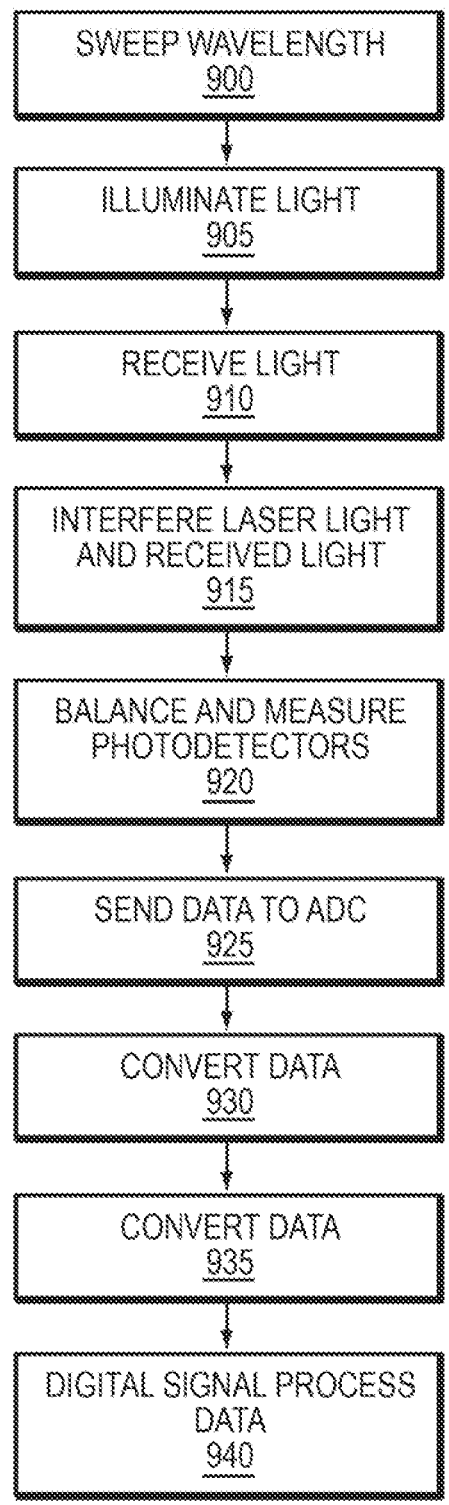
FIG. 9 is an alternative simplified method for creating an optical scan, in accordance with an embodiment of the present disclosure.

Refer now to the example embodiment of FIGS. 7 and 9, which illustrate an alternative simplified embodiment of scanning a scene. Sweeping laser 700 illuminates sweeps wavelength of the laser (step 900). Sweeping laser 700 illuminates scene 705 (step 905). PIC 710 receives light reflected of scene 705 (step 910). PIC 710 interferes light reflected off scene 705 with light split off from sweeping laser 700 (step 915). Photodetectors 715 on PIC 710 balance the received light (step 920). Output from photodetectors 715 on PIC 710 is sent to ADC (step 925). ADC converts the data from analog to digital (step 930). ADC sends the data to DSP (step 935). DSP calculates the scene data from the input from ADC to determine depth and horizontal and vertical location for each pixel (step 940).

In many embodiments, techniques of the current disclosure may require no moving parts (not even a MEMS mirror), may be very compact, and may be scalable to very high resolution scans. In most embodiments, collection efficiency may be irrelevant as the light transmitted is outside of a range that can impact human vision. In many embodiments, the power of the light used may not be a safety concern as it may be outside the range of light that is harmful to human vision.

In many embodiments, one or more of the current techniques may be performed on a Digital Signal Processing (DSP) of a receiver. In most embodiments, the output of the scanning system may be sent to a DSP. In certain embodiments, a DSP may process the captured light to determine a point cloud. In most embodiments, a point cloud may represent a set of 3 dimensional coordinates that correspond to objects in a scene. In certain embodiments, a scene may refer to an environment or space that may be scanned. In many embodiments, a DSP may be a custom designed ASIC chip. In most embodiments, a DSP may be able to determine change in the wavelength of reflected light. In many embodiments, a DSP may be able to detect change of phase of reflected light. In certain embodiments, a DSP may be able to detect other changes in the reflected light. In almost all embodiments, a DSP may be able to determine distance by looking at changes in reflected light. In many embodiments, a DSP may be able to determine location within three dimensions by looking at reflected light.

In some embodiments, one or more of the embodiments described herein may be stored on a computer readable medium. In certain embodiments, a computer readable medium may be one or more memories, one or more hard drives, one or more flash drives, one or more compact disk drives, or any other type of computer readable medium. In certain embodiments, one or more of the embodiments described herein may be embodied in a computer program product that may enable a processor to execute the embodiments. In many embodiments, one or more of the embodiments described herein may be executed on at least a portion of a processor.

In most embodiments, a processor may be a physical or virtual processor. In other embodiments, a virtual processor may be spread across one or more portions of one or more physical processors. In certain embodiments, one or more of the embodiments described herein may be embodied in hardware such as a Digital Signal Processor DSP. In certain embodiments, one or more of the embodiments herein may be executed on a DSP. One or more of the embodiments herein may be programed into a DSP. In some embodiments, a DSP may have one or more processors and one or more memories. In certain embodiments, a DSP may have one or more computer readable storages. In other embodiments, one or more of the embodiments stored on a computer readable medium may be loaded into a processor and executed. In some embodiments, communicatively coupled may mean connected in such a way to enable transfer of data.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The terms "approximately" and "about" may be used to mean within +20% of a target value in some embodiments, within +10% of a target value in some embodiments, within +5% of a target value in some embodiments, and yet within +2% of a target value in some embodiments. The terms "approximately" and "about" may include the target value.

In the claims, as well as in the specification above, all transitional phrases such as "comprising," "including," "carrying," "having," "containing," "involving," "holding," "composed of," and the like are to be understood to be open-ended, i.e., to mean including but not limited to. The transitional phrases "consisting of" and "consisting essentially of" shall be closed or semi-closed transitional phrases, respectively.

The terms "approximately" and "about" may be used to mean within +20% of a target value in some embodiments, within +10% of a target value in some embodiments, within +5% of a target value in some embodiments, or within +2% of a target value in some embodiments. The terms "approximately" and "about" may include the target value.

What is claimed is:

1. An apparatus for scanning a scene comprising:
a wavelength-sweeping laser arranged to flood illuminate the scene;
a photonic integrated circuit (PIC); the PIC including a plurality of gratings, wherein at least two gratings have a different pitch; a plurality of waveguides; a set of couplers; and a set of photodetectors; wherein each waveguide of the plurality of waveguides connects a grating of the plurality of gratings to a coupler of the set of couplers; wherein each coupler of the set of couplers is connected to a waveguide of the set of waveguides; wherein the PIC is arranged to capture light reflected from the scene from the wavelength-sweeping laser; and
a digital signal processor (DSP).

2. The apparatus of claim 1 wherein the plurality of gratings has a linear distribution in grating pitch.

3. The apparatus of claim 1 wherein the plurality of gratings has a stepwise distribution in grating pitch.

4. The apparatus of claim 1 wherein the plurality of gratings has a non-linear distribution in grating pitch.

5. The apparatus of claim 1 further comprising:
an analog digital converter (ADC); wherein the ADC is communicatively coupled to an output from the set photodetectors.

6. The apparatus of claim 5
wherein the digital signal processor is communicatively coupled to the ADC.

7. A method comprising:
illuminating a scene with flood illumination using light from a sweeping laser without scanning the scene;
receiving the light reflected off the scene from the sweeping laser at an array of gratings; wherein the received light substantially simultaneously travels down each waveguide of an array of waveguides on a PIC to a set of couplers; wherein each respective grating of the array of gratings has a respective waveguide of the array of waveguides connecting the each respective array of the array of gratings to a respective coupler of a set of couplers;
interfering, using each coupler of the set of couplers, the received light from the scene with light split from a wavelength-sweeping laser; and
measuring, using a set of photodetectors, the difference between the received light and the light split from the laser.

8. The method of claim 7 further comprising:
sending the measured difference to an analog digital converter; and
converting the measured difference to digital data.

9. The method of claim 8 further comprising:
sending the digital data to a digital signal processor (DSP); and
calculating a point cloud for the scene using the DSP.

10. A system comprising:
a wavelength-sweeping laser;
a photonic integrated circuit (PIC); the PIC including a plurality of gratings, wherein at least two gratings have a different pitch; a plurality of waveguides; a set of couplers; and a set of photodetectors; wherein each waveguide of the plurality of waveguides connects a grating of the plurality of gratings to a coupler of the set of couplers; wherein each coupler of the set of couplers is connected to a waveguide of the set of waveguides; wherein the PIC is arranged to capture light reflected from the scene from the wavelength-sweeping laser; wherein the PIC is enabled to:
receive the light reflected off the scene from the sweeping laser at an array of gratings; wherein the received light substantially simultaneously travels down each waveguide of an array of waveguides on a PIC to a set of couplers; wherein each respective grating of the array of gratings has a respective waveguide of the array of waveguides connecting the each respective array of the array of gratings to a respective coupler of a set of couplers;
interfere, using each coupler of the set of couplers, the received light from the scene with light split from the sweeping laser; and
measure, using a set of photodetectors, the interference between the received light and the light split from the wavelength-sweeping laser.

11. The system of claim 10 wherein the plurality of gratings has a linear distribution in grating pitch.

12. The system of claim 11 further comprising:
an analog to digital converter (ADC); wherein the PIC is enabled to send the measured difference to an analog digital converter; wherein the ADC is enabled to convert the measured difference to digital data.

13. The system of claim 12 further comprising:
a digital signal processor (DSP); wherein the ADC is enabled to send the digital information to the DSP; wherein the DSP is enabled to calculate a point cloud for the scene using the DSP.

14. The system of claim 13 wherein the wavelength-sweeping laser is enabled to project light on the scene using a sweeping laser.

15. The apparatus of claim 10 wherein the plurality of gratings has a step-wise distribution in grating pitch.

16. The apparatus of claim 10 wherein the plurality of gratings has a non-linear distribution in grating pitch.

* * * * *